United States Patent
Knall (10) Patent No.: US 7,304,888 B2
(45) Date of Patent: Dec. 4, 2007

(54) REVERSE-BIAS METHOD FOR WRITING MEMORY CELLS IN A MEMORY ARRAY

(75) Inventor: N. Johan Knall, Sunnyvale, CA (US)

(73) Assignee: Sandisk 3D LLC, Milpitas, CA (US)

( * ) Notice: Subject to any disclaimer, the term of this patent is extended or adjusted under 35 U.S.C. 154(b) by 99 days.

(21) Appl. No.: 11/174,234

(22) Filed: Jul. 1, 2005

(65) Prior Publication Data
US 2007/0002610 A1 Jan. 4, 2007

(51) Int. Cl.
*G11C 11/36* (2006.01)
*G11C 11/00* (2006.01)

(52) U.S. Cl. .................. 365/175; 365/96; 365/106; 365/163

(58) Field of Classification Search .......... 365/175
See application file for complete search history.

(56) References Cited

U.S. PATENT DOCUMENTS

| | | | | |
|---|---|---|---|---|
| 5,379,250 A * | 1/1995 | Harshfield | .................. | 365/105 |
| 5,818,749 A * | 10/1998 | Harshfield | .................. | 365/105 |
| 6,034,882 A * | 3/2000 | Johnson et al. | ............. | 365/103 |
| 6,420,215 B1 * | 7/2002 | Knall et al. | .................. | 438/131 |
| 6,426,891 B1 * | 7/2002 | Katori | ......................... | 365/175 |
| 6,515,888 B2 * | 2/2003 | Johnson et al. | ............. | 365/130 |
| 6,587,394 B2 * | 7/2003 | Hogan | .................... | 365/230.06 |
| 6,704,235 B2 * | 3/2004 | Knall et al. | .............. | 365/225.7 |
| 6,784,517 B2 | 8/2004 | Kleveland et al. | | |
| 6,816,410 B2 * | 11/2004 | Kleveland et al. | ...... | 365/185.03 |
| 6,937,507 B2 * | 8/2005 | Chen | .......................... | 365/163 |
| 6,937,528 B2 * | 8/2005 | Hush et al. | ............ | 365/189.07 |
| 2003/0081445 A1 * | 5/2003 | Van Brocklin et al. | ..... | 365/100 |
| 2003/0169625 A1 * | 9/2003 | Hush et al. | ............ | 365/189.07 |
| 2006/0197115 A1 * | 9/2006 | Toda | .......................... | 257/248 |
| 2006/0203541 A1 * | 9/2006 | Toda | .......................... | 365/163 |
| 2006/0268594 A1 * | 11/2006 | Toda | .......................... | 365/100 |

OTHER PUBLICATIONS

Muller, et al., "Device Electronics for Integrated Circuits, Second Edition", *John Wiley & Sons, Inc.*, (1986), 192-200.

* cited by examiner

*Primary Examiner*—Son L. Mai
(74) *Attorney, Agent, or Firm*—Dugan & Dugan PC (57) ABSTRACT

A memory array having memory cells each comprising a diode and a phase change material or antifuse is reliably programmed by maintaining all word lines and bit lines connected to unselected memory cells at intermediate voltages and applying voltages to place the diode of a selected cell or cells in a reverse biased state and sufficient to program the phase change material or antifuse. Thus leakage through unselected cells is low so power wasted is small, and assurance is high that no unselected memory cells are disturbed.

28 Claims, 5 Drawing Sheets

REVERSE-BIAS METHOD FOR WRITING MEMORY CELLS IN A MEMORY ARRAY

RELATED APPLICATIONS

Concurrently filed commonly assigned patent application Ser. No. 11/174,240 entitled "HIGH K ANTIFUSE FOR REVERSE BIAS PROGRAMMING" invented by James M. Cleeves (MA-154) describes a high-dielectric constant antifuse that may be used with the present invention. Concurrently filed commonly assigned patent application Ser. No. 11/173,973 entitled "MEMORY WITH HIGH DIELECTRIC CONSTANT ANTIFUSES AND METHOD FOR USING AT LOW VOLTAGE" (MA-155) describes a structure and method for achieving low voltage programming. The subject matter of these applications is incorporated herein by reference.

BACKGROUND OF THE INVENTION

The invention relates to programming a nonvolatile memory cell comprising a diode in series with an antifuse or other state change element.

Large integrated circuit memory arrays may comprise a large number of memory cells arranged in an array. The array may be flat rectangular or it may be 3-dimensional, in which multiple layers of rectangular arrays of memory cells are formed in a vertical stack. The memory cells may each comprise a high resistance material such as an antifuse or chalcogenide, which may be programmed to a low resistance state. In the case of an antifuse, the memory is one-time programmable and once the low resistance state is entered, it is not reversed. In the case of a chalcogenide, the state may be returned to high resistance (the memory cell may be un-programmed). For more selective programming, the memory cell commonly also comprises a diode for better controlled selection of the memory cell to be programmed.

In order to program a memory cell, voltages are typically applied to word and bit lines that contact opposite ends of the memory cell, causing current to pass through the memory cell for programming.

When a memory cell including a diode is to be programmed through word and bit lines connected to the memory cell, it is known to apply a programming voltage in the forward direction of the memory cell diode, and to apply compensating voltages to word and bit lines contacting memory cells not to be programmed. See Kleveland, et al., U.S. Pat. No. 6,816,410 entitled "METHOD FOR PROGRAMMING A THREE-DIMENSIONAL MEMORY ARRAY INCORPORATING SERIAL CHAIN DIODE STACK" issued Nov. 9, 2004 and owned by Matrix Semiconductor, Inc. Also see Kleveland and Knall U.S. Pat. No. 6,784,517 entitled "THREE-DIMENSIONAL MEMORY ARRAY INCORPORATING SERIAL CHAIN DIODE STACK" (Knall is the inventor of the present invention), and commonly assigned to Matrix Semiconductor, Inc.

It is desirable to improve the reliability of memory cell programming and to reduce power consumption as compared to such prior art methods.

SUMMARY OF THE INVENTION

The present invention is defined by the appended claims, and nothing in this section should be taken as a limitation on those claims. In general, the invention is directed to methods of programming an array of nonvolatile memory cells each comprising a state change element in series with a diode. The invention takes advantage of the asymmetrical nature of a diode and applies biasing voltages that minimize leakage current through unselected cells.

According to the invention, in a memory with memory cells each having a diode and a structure for which resistance can be changed, a selected cell or group of cells is programmed by applying voltages to word lines and bit lines connected to the selected cell or cells, resulting in a programming current through the selected cell or cells in the reverse direction of easiest current flow in the diode. In some embodiments, a negative programming voltage may be applied to a programming line connected to the cell or cells. Intermediate voltages are applied to word lines and bit lines not connected to the selected cell or cells. Because voltage is applied to the selected cell in the reverse biased direction, the intermediate voltages can now be chosen to be close to each other or the same. The intermediate voltages can also be chosen to be close to the midpoint between the programming voltages applied to the selected cell. This results in reduced voltage differences between the selected cell and its neighbors compared to prior art methods described in the above referenced patents. Therefore it is less likely that erroneous programming will occur. In addition, during the reverse-write method of the invention, no cells in the array will experience a forward bias voltage on their diodes. Hence injection of holes (or minority carriers) from half-selected cells into unselected neighbors does not occur.

In the voltage configuration of the invention, since the intermediate voltages are close to each other, the bias across unselected cells will be close to zero. This leads to a significant reduction in power consumption during programming. Also, reverse biasing the diodes of selected cells alleviates the prior art requirement that antifuses be leaky to prevent the high reverse bias from programming unselected cells, and thus leaves greater freedom when designing the antifuses and diodes in the memory array.

Another advantage to putting the unselected word and bit lines at an intermediate voltage is that switching between one write operation and the next is faster because the lines encounter less voltage swing.

The invention can be applied to 3-dimensional memories formed as both rail and pillar memory structures. (Rail structures are memories in which all the layers constituting the diode anode, diode cathode and the antifuse are patterned to extend along the conductors constituting word lines or bit lines. The memory cells are located where a stack of layers that includes the anode crosses a stack of layers that includes the cathode. Pillar structures are memories in which some of the layers that form the diode and antifuse or other state change material of the memory cell reside in a pillar vertically disposed at the intersection between row and column conductors.)

DETAILED DESCRIPTION OF PREFERRED EMBODIMENTS OF THE INVENTION

Figure 1:
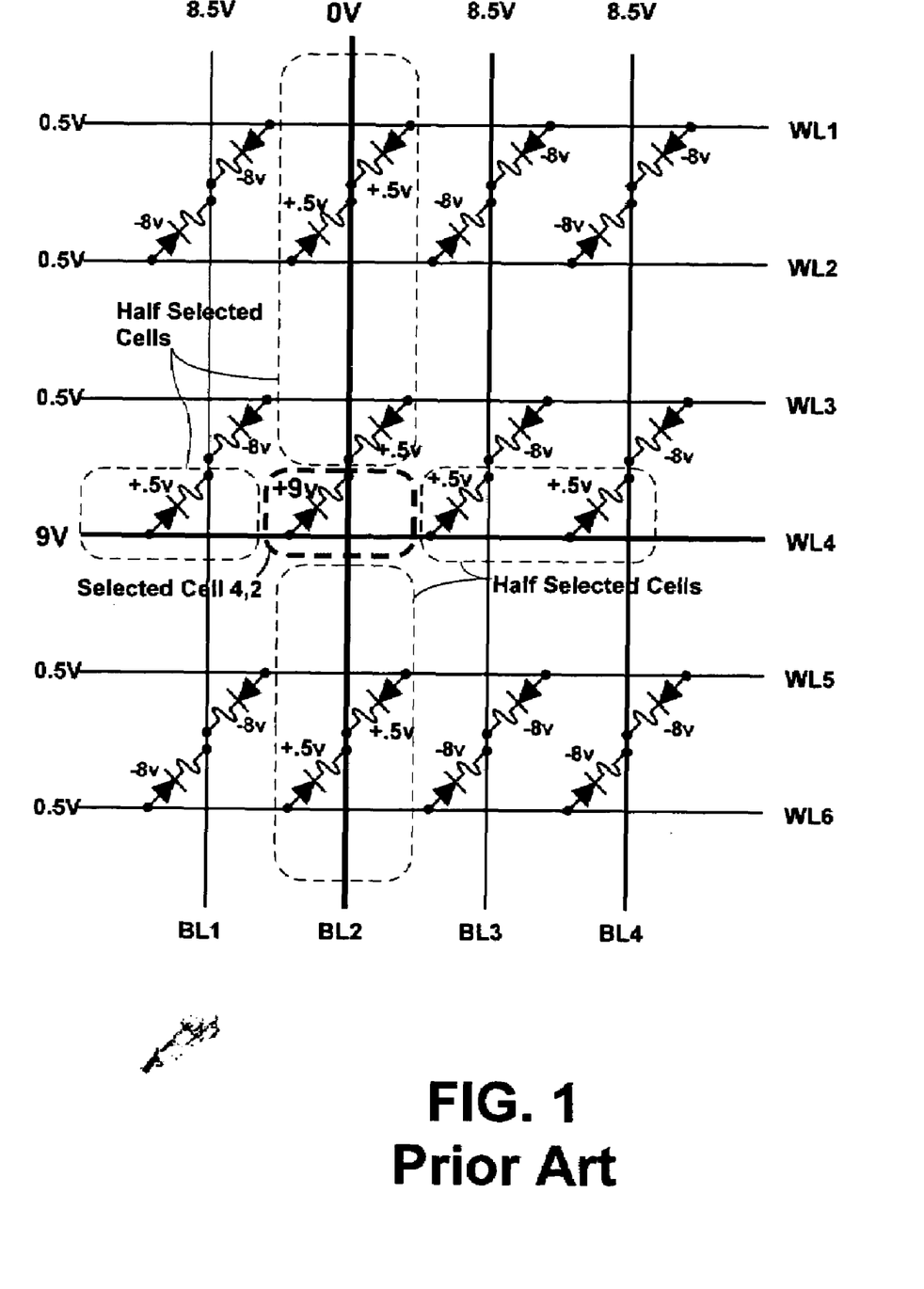
FIG. 1 is a memory array showing prior art programming voltages.

FIG. 1 shows a representative array having several word lines and bit lines. Commercial memory arrays typically have many more memory cells, word lines and bit lines than are shown. In this array, each memory cell comprises a diode in series with an antifuse. In the example of FIG. 1, a memory cell 4,2 at the intersection of word line WL4 and bit line BL2 is to be programmed (written). To accomplish the programming, a voltage of 9 volts was applied to word line WL4 and a voltage of 0 volts was applied to bit line BL2. To prevent programming of other memory cells, remaining word lines each received voltages of 0.5 volts and remaining bit lines each received voltages of 8.5 volts. This resulted in a forward bias of 9 volts to the selected cell, which was sufficient to cause high current flow through the cell, rupturing the antifuse and programming the selected cell. It also resulted in a forward bias of +0.5 volts to half-selected cells connected to word line WL4 and to bit line BL2. With a forward bias of +0.5V only a small current passed through the half selected cells. However, most of the memory cells within an array are unselected. The applied voltages of FIG. 1 caused the unselected cells to all receive a reverse bias of −8.0 volts. In order to avoid reverse bias breakdown, the diodes had to be manufactured so that they could tolerate the reverse bias of 8 volts, and the antifuses had to be manufactured to be somewhat leaky so that most of the voltage drop was across the diode and not the antifuse to assure that this relatively high voltage did not cause programming of the antifuse in unselected cells. However, during programming, the reverse leakage through the unselected cells caused power drain. In a large array having many unselected memory cells, this power drain can be considerable. For example, in a two-dimensional array of 1000×1000 memory cells, there are one million memory cells. If only one row and one bit line are selected, there are 999×999 unselected cells all receiving an 8-volt bias, producing considerable power drain through the array. It is always desirable to minimize power drain, and particularly important to minimize power drain in battery operated applications.

The diodes used in the array had to have a reverse-biased conductivity that is similar to or smaller than the conductivity of the unprogrammed antifuse. Given the fact that typical polycrystalline diodes have considerable reverse-biased conductivity, this precluded the use of low conductivity antifuses (or other state change elements). A high leakage conductivity antifuse used in a memory cell with asymmetric breakdown voltage was described in U.S. Pat. No. 6,704,235 entitled "ANTI-FUSE MEMORY CELL WITH ASYMMETRIC BREAKDOWN VOLTAGE" invented by Knall (inventor of the present invention) et al. and commonly assigned to Matrix Semiconductor, Inc. The subject matter of this patent is incorporated herein by reference. But if the conductivity of un-programmed antifuses is large, the conductivity of programmed antifuses must be correspondingly larger. This high programmed antifuse conductivity is difficult to achieve in small high density memory structures. Thus, it has become desirable to use antifuses with lower conductivity than those used in such prior art methods.

Another problem exists for the method of FIG. 1. It sometimes occurred that cells adjacent to selected cells were disturbed during a write operation, or that cells on the same word line or bit line as selected cells were disturbed during the write operation. This problem became increasingly important as operating voltages decreased, write speeds increased, memory cell densities increased, and array sizes increased. It sometimes occurred that neighbor cells were inadvertently programmed because of leakage due to proximity of the cells, as will now be explained.

Figure 2:
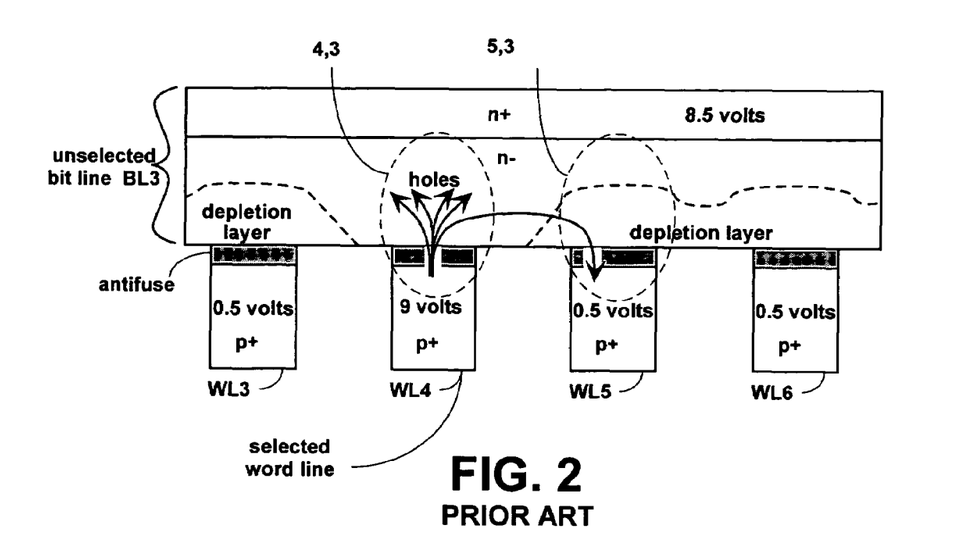
FIGS. 2 and 3 show detail of the layout of a 3-dimensional memory array in which prior art voltages applied to unselected and selected bit lines can inadvertently program adjacent memory cells.
Figure 3:
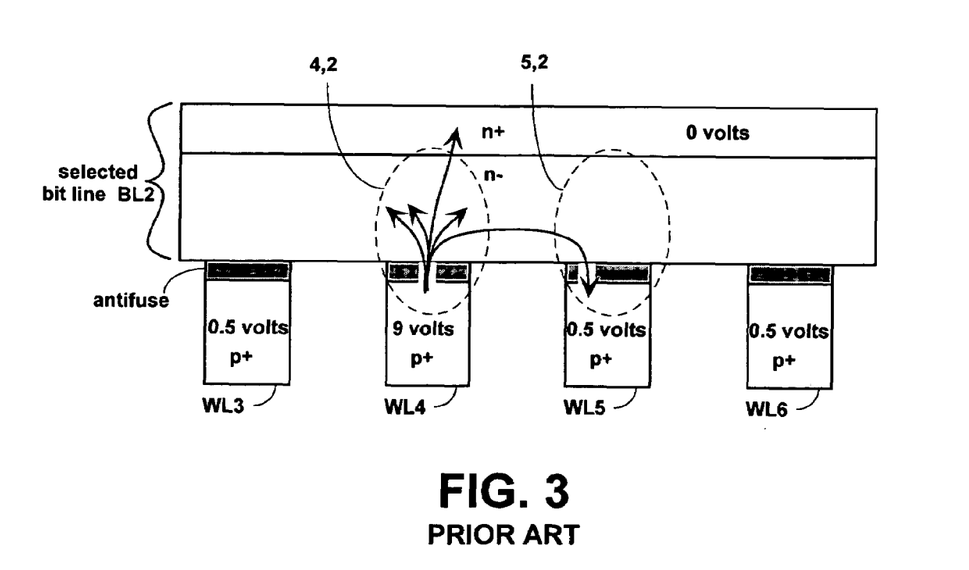

FIGS. 2 and 3 show detail of portions of such a memory array. In FIG. 2, word lines WL3 through WL6 of FIG. 1 are extending out of the plane of the drawing. Bit line BL3 is shown running horizontally and consisting of a heavily doped n+ portion above a lightly doped n− or un-doped portion. In the example, memory cell 4,3 located at the intersection of bit line BL3 and word line WL4 shown in FIG. 2 has been previously programmed, and the memory cell 4,2 located at the intersection of word line WL4 and bit line BL2 shown in FIG. 3 is to be programmed. But while the memory cell 4,2 is being programmed, unselected bit line BL3 (FIG. 2) carries a voltage of +8.5 volts. Selected word line WL4 carries a voltage of 9 volts and other unselected word lines WL3, WL5, and WL6 carry voltages of +0.5 volts. Thus, as shown in FIG. 2, selected word line WL4 injects holes into the n− region of bit line BL3, and the close proximity and large voltage difference between word lines WL3, WL4, and WL5 may cause a hole injection current from word line WL4 to word line WL3 or WL5, erroneously programming an adjacent memory cell. In FIG. 2, memory cell 5,3 at the intersection of bit line BL3 and word line WL5 is shown as erroneously programmed. Such programming is unintentional and must be avoided.

FIG. 3 shows selected memory cell 4,2 at the intersection of selected word line WL4 and selected bit line BL2. Memory cell 4,2 is intended to be programmed. Current flows from word line WL4, at 9 volts, to selected bit line BL2, at 0 volts, thus programming the antifuse at memory cell 4,2. However, because of the high voltage difference between word lines WL4 and WL5, small irregularities in the manufacturing process may allow current to also flow from word line WL4 to word line WL5, thus programming memory cell 5,2 at the intersection of word line WL5 and bit line BL2, as shown. This is another erroneous result and is unacceptable.

I have found that this prior art forward-biased write method requires that the diode have a reverse-bias leakage smaller than that of the antifuse, so that the diodes and not the antifuses of unselected memory cells bear most of the large voltage drop (8.5 volts in the example), and the antifuses are not inadvertently programmed. But the reverse leakage of a diode formed from layers of p+ and n− polycrystalline silicon is primarily dependent upon thickness of the n− layer. To achieve low enough leakage, a minimally doped n− layer may require a thickness of greater than 200 nm. This relatively large n− thickness leads to a high aspect ratio and limits further shrinkage in the horizontal direction of the device sizes. Given the fact that polycrystalline diodes are still typically somewhat leaky, the antifuses must also be made leaky. But, as mentioned above, this leakage makes it difficult to distinguish an unprogrammed memory cell from a programmed memory cell.

Thus I have found that the prior art programming method illustrated by FIG. 1 has disadvantages of drawing high power during programming and possible unintended programming of cells in close proximity to cells being programmed. It has the further disadvantage of requiring rigorous manufacturing conditions to avoid erroneous programming. It is desirable to avoid these problems.

Figure 4:
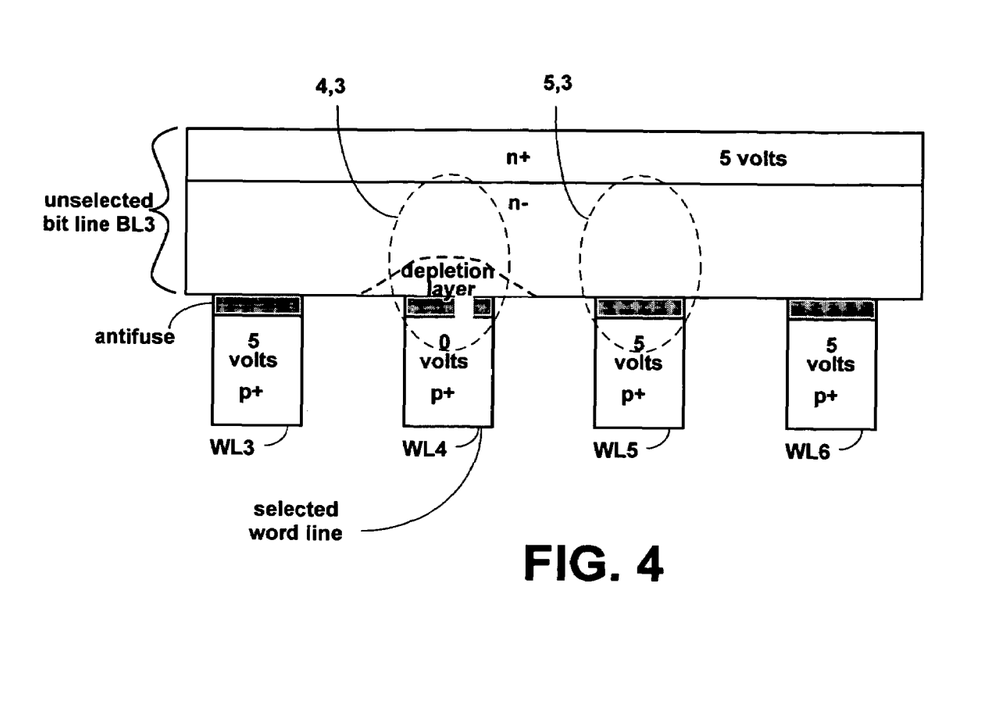
FIGS. 4 and 5 show detail of the layout of a 3-dimensional memory array in which voltages applied to unselected and selected bit lines according to the invention do not disturb adjacent memory cells.
Figure 5:
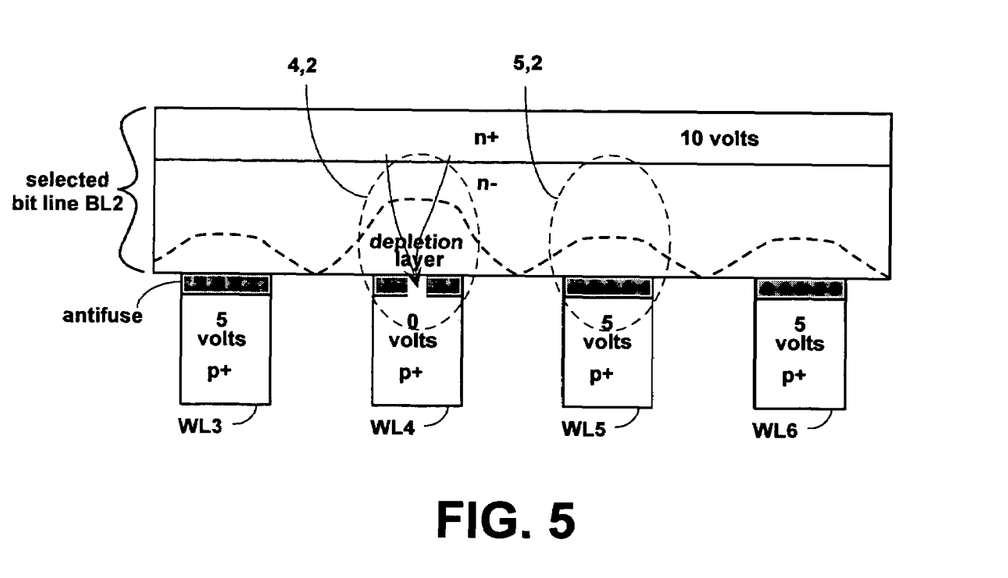

According to the invention, a reverse bias is applied across a selected memory cell or cells in order to program the cell to a lower resistance state. FIGS. 4 and 5 show side views of unselected, half-selected, and selected cells in an array programmed according to the invention.

FIG. 4 shows an unselected bit line BL3 adjacent several word lines including selected word line WL4. Unselected cells such as cell 5,3 exist at the intersection of unselected word lines such as WL5 with unselected bit line BL3. Half-selected cells such as cell 4,3 exist at the intersection of selected word line WL4 and unselected bit line BL3. As in the example of FIG. 2, cell 4,3 has been previously programmed. However, unlike in FIG. 2, cell 5,3 in FIG. 4 is not erroneously programmed, because the voltage difference between word line WL4 and word line WL5 is only about half the programming voltage.

FIG. 5 shows a selected bit line BL2, several unselected word lines WL3, WL5, WL6 along with selected word line WL4. The intersection of selected bit line BL2 and selected word line WL4 defines the selected cell 4,2. As shown in FIG. 5, selected bit line BL2 receives 10 volts and selected word line WL4 receives 0 volts. This is a reverse bias voltage difference because the natural current flow in a diode is from the p or p+ terminal to the n−, n or n+ terminal. Other word lines and bit lines receive 5 volts (or approximately the same intermediate voltage) so that unselected cells (where neither the word line or the bit line is selected) receive no voltage drop or a small voltage drop, resulting in low leakage and thus low power consumption. Since the voltage applied to the half-selected cells is enough lower than the programming voltage, unintended programming will not occur, and it is not necessary to assure that voltage on unselected or half-selected cells is evenly divided between the diode and the antifuse of the cell. Therefore, it is acceptable to use an antifuse that is not leaky in combination with a diode having a relatively large reverse leakage, or to use a non-destructive reverse breakdown diode that is not leaky below its breakdown voltage. Thus power loss is far lower than with the prior art method discussed above. Manufacture of non-destructive reverse breakdown devices is well known. Zener diodes are such devices. The physics of nondestructive reverse breakdown is described in text books, for example pages 193-200 of R. S. Muller, T. I. Kamins, "Device Electronics for Integrated Circuits", John Wiley and Sons, Inc., 1986. The breakdown voltage depends upon such factors as material composition, doping, and layer thickness. Compared to the prior art method discussed above, the present invention allows more freedom to engineer the type of diode and antifuse to be used.

In one embodiment, an antifuse is present in each cell of the memory array, and the cell can be programmed to the lower resistance state by passing a high current through the antifuse, which is believed to melt the antifuse material, forming a permanent conductive path through the antifuse. In FIG. 5, arrows indicate the high current path through the antifuse at cell 4,2, which programs the antifuse of memory cell 4,2. Unlike the prior art arrangement shown in FIGS. 2 and 3, there will be no inadvertent programming of adjacent memory cells because voltage differences with neighboring cells are only about half the programming voltage, which is too low to cause programming even in the presence of small manufacturing defects. And for unselected cells, there is no (or in some embodiments small) voltage drop between unselected word and bit lines, and therefore no leakage current and no power loss occur in these unselected cells. Even in the half-selected cells that share a word line or bit line with the selected cell or cells, the power loss is small because the voltage difference is only about half the programming voltage (in the illustrated example, 5 volts), and the number of half-selected cells is much smaller than the number of unselected cells that experienced leakage under the prior art programming method discussed above. With the method of the invention available, many diode characteristic curves are acceptable, and it is not necessary to carefully match the diode characteristics with the antifuse characteristics in order to avoid erroneous programming.

Figure 6:
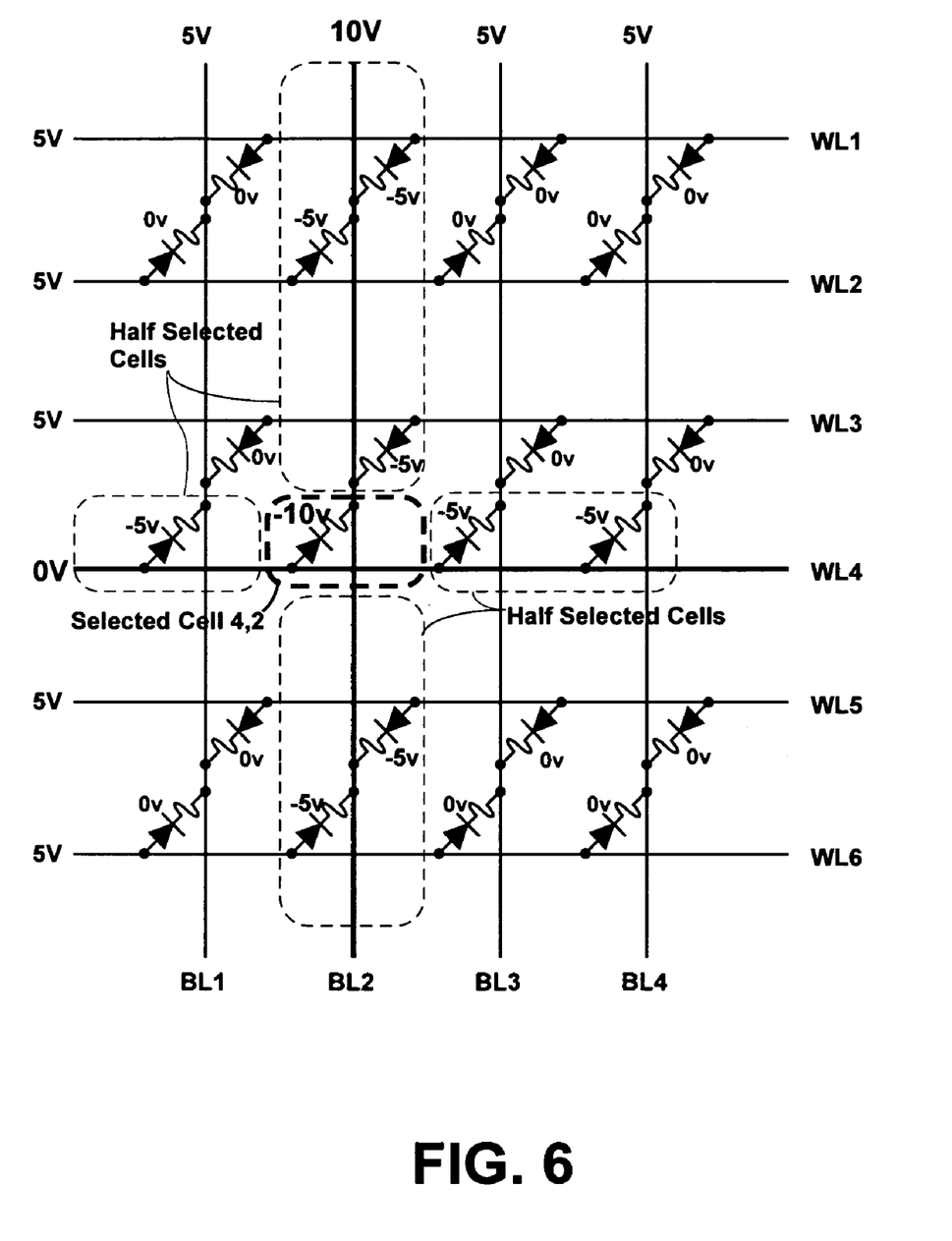
FIG. 6 shows a memory array with programming voltages according to the invention.

FIG. 6 also shows application of voltages according to the invention. In the illustration of FIG. 6, the selected cell 4,2 at word line WL4 and bit line BL2 receives a reverse bias voltage drop of 10 volts. Other voltages may be used, the important factor being to apply a voltage in the reverse direction of the diode that is sufficient to open the antifuse or other high resistance barrier in the cell.

Figure 7:
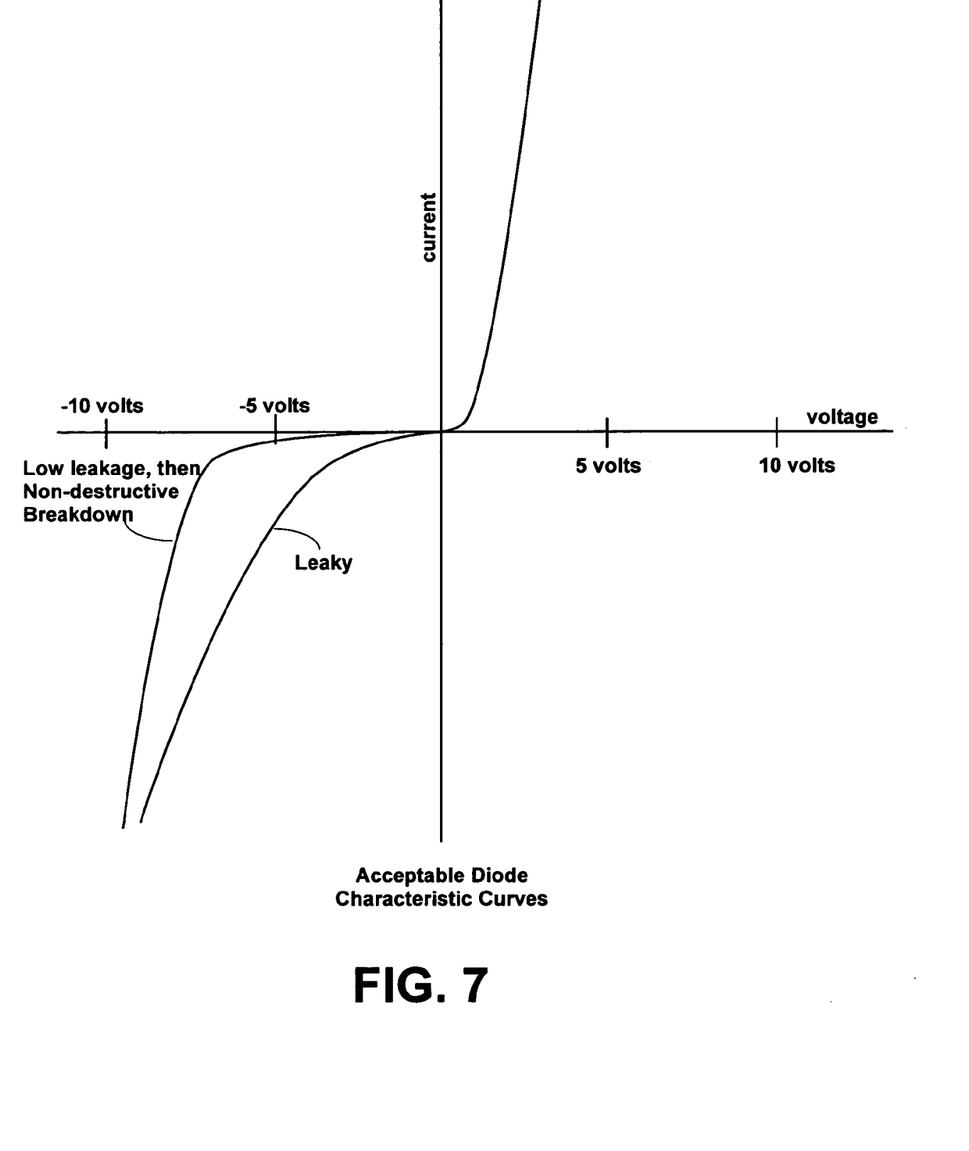
FIG. 7 shows characteristic curves of diodes appropriate for use with the invention.

FIG. 7 shows two suitable diode characteristic curves. It is beneficial to use diodes that at the programming voltage have a relatively high reverse conductivity compared to the unprogrammed antifuse. This can be achieved in several ways. The memory cell can be formed from polysilicon diodes and antifuses made from oxides and/or nitrides of silicon. In one case (left-most curve), the diode has low leakage below the breakdown voltage and quickly moves to a high but non-destructive breakdown current at a voltage below the programming voltage. In the leaky case (right-most curve), the reverse current increases more gradually with increasing reverse bias, resulting in more leakage at low reverse bias. Both curves are acceptable with the invention, though the low-leakage curve provides increased protection against inadvertent programming of half-selected cells, and also provides lower leakage power loss. Both of these diode characteristic curves allow substantial current to flow at −10 volts, causing a low resistance path to form (permanently in the case of an antifuse or reversibly in the case of a phase change material such as chalcogenide), thus programming the memory cell 4,2 that exists at the junction. Reducing the thickness of the low-doped layer (the n− layer in a p+n− diode) increases the reverse leakage of a polycrystalline silicon diode. The fact that reverse write enables the use of more leaky diodes can be used to advantage to reduce the thickness of the n− layer, in one embodiment to <180 nm, which in turns reduces the aspect ration of the structures and allows for lateral shrinkage and higher cell density. In the related U.S. patent application Ser. No. 11/174,240[MA-154]incorporated herein by reference, James M. Cleeves describes a device in which materials with high dielectric constant (low conductivity, low leakage) are used in antifuses to decrease conductivity of unprogrammed cells, making it easier to distinguish them from programmed cells.

If a high conductivity of a programmed cell is required, a method of double programming can be used. The cell is first programmed using a high reverse bias (~10 V) and low programming current (~10 µA), then reprogrammed in the forward direction at a lower voltage (~4 V) and higher current (~100 µA). Such a subsequent step has the advantage of increasing the cross-section of the programmed path in the antifuse and therefore reducing resistance to any reading current to be passed through the programmed cell. The second forward programming step is similar to prior art programming, but a lower voltage can be used since the cell has been pre-programmed by the preceding reverse programming step. This second step can also be used when a diode with small reverse conductivity is present. If the current gets too high during programming it is possible to destroy such a cell, so it is in general necessary to limit the programming current in some way. This can be done by adjusting the conductivity of drive transistors in the control circuitry and/or the bit lines and word lines, or by using active current regulation. To achieve a reasonable programming speed for the memory, the programming voltage is typically set so that the average programming time for a cell is on the order of 200 ns. However, much shorter or longer times can also be used. And if the programmable element is a reversible material such as a chalcogenide, the programming time and voltage will depend upon the intended final state (high conductivity or low conductivity) of the programmable element. A repeatedly programmable element such as a chalcogenide may be programmed and unprogrammed using a current characteristic such as discussed by Scheuerlein in commonly assigned U.S. patent application Ser. No. 11/040,262 filed Jan. 19, 2005 and entitled "Structure and Method for Biasing Phase Change Memory Array for Reliable Writing". This related patent application is incorporated herein by reference.

The above description has used the example of programming with programming voltages of 0 and 10 volts and unselected voltages of 5 volts. However, other voltages may be used, depending upon the technology of the manufactured device. As device sizes continue to shrink, the preferred voltages to be used with the invention will correspondingly shrink. Also, while the illustrations show intermediate voltages half way between the two voltages applied to selected cells, it is not necessary that these voltages be exactly half way between or that they be the same. The intermediate voltages simply need to be close enough to each other, and selected so as to minimize leakage and minimize the possibility of inadvertent programming of unselected cells.

The present method of programming applies to both a well known two-dimensional memory array integrated circuit layout and a three-dimensional memory array such as described in other patents and publications of Matrix Semiconductor, Inc., assignee of the present invention. Illustrations in FIGS. 4-5 are of a rail-type structure in which a diode is formed by laying out the word lines and bit lines in a crossing-type arrangement with p-type portions of word lines crossing n-type bit lines. In other embodiments, the memory cells comprising diodes plus antifuses (or phase change materials) are formed in pillars that extend between the conductive layers that have been patterned to form word lines and bit lines. Scheuerlein in U.S. patent application Ser. No. 11/040,262 shows such pillar structures and has been incorporated herein by reference. Such alternative structures are intended to be included in the scope of the present invention. Further, although the illustrations show word lines and bit lines in particular locations, this word-line-bit-line terminology is arbitrary and may be reversed. Other embodiments, variations, and improvements not described in detail herein but which are obvious in light of the above disclosure are intended to be included in the scope of the invention.

What is claimed is:

1. In a memory array having memory cells at intersections of first lines and second lines, each memory cell having a diode cathode end connected to a first line and a diode anode end connected to a second line, each memory cell initially occupying a high resistance state, a method of programming the memory cells comprising:

applying a first voltage to at least one first line contacting the cathode end of at least one selected memory cell to be programmed to a different state;

applying a second voltage to first lines not contacting the cathode end of the at least one selected memory cell;

applying a third voltage to at least one second line contacting the anode end of at least one selected memory cell; and applying a fourth voltage to second lines not contacting the anode end of the at least one selected memory cell;

wherein the first voltage is higher than the third voltage by an amount sufficient to program the at least one selected memory cell to a different state and the second and fourth voltages are at intermediate levels between the first and third voltages, wherein further programming of the at least one selected memory cell is performed in which the first and third voltages are subsequently changed to cause current to pass through the diode in a forward biased direction, and wherein the memory cells each include a diode in series with a state change element.

2. The method of programming the memory cells as in claim 1, wherein the second and fourth voltages are equal.

3. The method of programming the memory cells as in claim 1, wherein the second and fourth voltages are not equal.

4. The method of programming the memory cells as in claim 1, wherein the second and fourth voltages are approximately half way between the first and third voltages.

5. The method of programming the memory cells as in claim 1, wherein the further programming uses a higher current than was used during applying the first and third voltages.

6. The method of programming the memory cells as in claim 1, wherein the further programming uses first and third voltages having a smaller voltage difference than was used during applying the first and third voltages to program the at least one selected memory cell to a different state.

7. The method of programming the memory cells as in claim 1, wherein the state change element includes an antifuse.

8. The method of programming the memory cells as in claim 7, wherein the antifuse is located at the diode cathode end.

9. In a memory array having memory cells at intersections of first lines and second lines, each memory cell having a diode cathode end connected to a first line and a diode anode end connected to a second line, each memory cell initially occupying a high resistance state, a method of programming the memory cells comprising:

applying a first voltage to at least one first line contacting the cathode end of at least one selected memory cell to be programmed to a different state;

applying a second voltage to first lines not contacting the cathode end of the at least one selected memory cell;

applying a third voltage to at least one second line contacting the anode end of at least one selected memory cell; and applying a fourth voltage to second lines not contacting the anode end of the at least one selected memory cell, wherein the first voltage is higher than the third voltage by an amount sufficient to program the at least one selected memory cell to a different state and the second and fourth voltages are at intermediate levels between the first and third voltages, wherein the memory cells each include a diode and a state change element connected in series and wherein the state change element is located at the diode anode end.

10. The method of programming the memory cells as in claim 7, wherein the diode is formed partially within a rail carrying a bit line and partially within a rail carrying a word line.

11. The method of programming the memory cells as in claim 7, wherein the diode is formed in a pillar extending vertically between horizontal rails carrying a word line and a bit line.

12. The method of programming the memory cells as in claim 1, wherein the state change element is a chalcogenide.

13. The method of programming the memory cells as in claim 12, wherein the chalcogenide is at the cathode end.

14. The method of programming the memory cells as in claim 12, wherein the chalcogenide is at the anode end.

15. The method of programming the memory cells as in claim 1, wherein each of the memory cells comprises a diode having a high impedance forward biased state and a low impedance forward biased state.

16. The method of programming the memory cells as in claim 1, wherein the at least one memory cell is one memory cell.

17. The method of programming the memory cells as in claim 1, wherein the at least one memory cell is a plurality of memory cells comprising a word of memory.

18. The method of programming the memory cells as in claim 1, wherein the first lines are bit lines and the second lines are word lines.

19. The method of programming the memory cells as in claim 1, wherein the first lines are word lines and the second lines are bit lines.

20. In a memory array having memory cells each comprising a diode and a material with programmable resistance, the memory cells being arranged in an array of first and second programming lines, a method of programming the memory cells comprising:
   applying a positive programming voltage to a first programming line connected to a cathode end of at least one selected memory cell and negative programming voltage to a second programming line connected to an anode end of the at least one selected memory cell; and
   applying intermediate voltages to first and second programming lines not connected to cathode or anode ends of the at least one selected memory cell.

21. The method of programming the memory cells as in claim 20, wherein the material with programmable resistance is an antifuse having initial high resistance that can be changed to a low resistance by the positive and negative programming voltages.

22. The method of programming the memory cells as in claim 20, wherein the material with programmable resistance is a state change material having a resistance that is made high by a high current quickly removed and made low by a current lower than the high current that is removed more gradually than the high current.

23. The method of programming the memory cells as in claim 22, wherein the state change material is a chalcogenide.

24. In a memory array having memory cells each comprising an antifuse and a diode, a method of programming the antifuse comprising:
   passing current through the diode and antifuse in the reverse bias direction of the diode at sufficient voltage to cause the antifuse to rupture; and
   passing current through the diode and antifuse in the forward bias direction of the diode at sufficient current and for sufficient time to cause the antifuse to develop a low resistance path.

25. The method of programming the memory cells as in claim 24, wherein the steps are performed in the order stated.

26. The method of programming the memory cells as in claim 24, further comprising applying to memory cells not sharing a bit line or word line with the antifuse an intermediate voltage insufficient to program the memory cells not sharing.

27. The method of programming the memory cells as in claim 9, wherein the state change element is an antifuse.

28. The method of programming the memory cells as in claim 9, wherein the state change element is a chalcogenide.

* * * * *